(12) United States Patent
Hong

(10) Patent No.: US 6,458,608 B1
(45) Date of Patent: Oct. 1, 2002

(54) ALIGNMENT CHECK METHOD ON PRINTED CIRCUIT BOARD

(75) Inventor: Mark Hong, Hsin-Chu (TW)

(73) Assignee: Hannstar Display Corp., Tao-Yuan (TW)

( * ) Notice: Subject to any disclaimer, the term of this patent is extended or adjusted under 35 U.S.C. 154(b) by 0 days.

(21) Appl. No.: 09/912,839

(22) Filed: Jul. 25, 2001

(30) Foreign Application Priority Data

Sep. 21, 2000 (TW) .......................................... 89119425 A

(51) Int. Cl.[7] .............................................. H01L 21/66
(52) U.S. Cl. ...................................................... 438/14
(58) Field of Search .............................. 438/15, 14, 18, 438/12, 975

(56) References Cited

U.S. PATENT DOCUMENTS 4,896,946 A * 1/1990 Suzuki et al. ................ 350/336
5,709,576 A * 1/1998 Lippmann et al. ............. 445/3
6,118,081 A * 9/2000 Faragi et al. ................ 174/260
6,162,064 A * 12/2000 Faragi et al. ................. 439/66

* cited by examiner

Primary Examiner—David Nelms
Assistant Examiner—Quoc Hoang
(74) Attorney, Agent, or Firm—Powell Goldstein Frazer & Murphy LLP

(57) ABSTRACT

The present invention provides a checking alignment method for a printed circuit board (PCB). The present method comprises following steps. First, a substrate and a PCB are provided. Then, a tape automated bonding process is performed to attach the substrate and the PCB by using a plurality of tapes. Next, a welding process is performed to connect original dummy lines on the substrate, those tapes, and the PCB to make a testing circuit for checking alignment. The present invention uses visible processes and equipment to check alignment. The present invention can judge more than two wrong alignment positions and quickly find each of wrong positions.

18 Claims, 3 Drawing Sheets

ALIGNMENT CHECK METHOD ON PRINTED CIRCUIT BOARD

BACKGROUND OF THE INVENTION

1. Field of the Invention

The present invention generally relates to a checking alignment method for a printed circuit board, and more particularly relates to a checking alignment method for a printed circuit board in a liquid crystal display manufacture.

2. Description of the Prior Art

Liquid crystal display (LCD) is commonly referred to as electric equipment in the past twenty years. With current technology, the display function of the LCD has apparently advanced, especially in film tape, low weight, and low power consumption. Recently, the aim of development in LCD's is the pursuit of a big display size and high pixel resolution.

Conventionally, the LCD substrate and drive Integrated circuits are attached by using chip on board (COB) technology, which uses an epoxy to adhere and seal chips on the printed circuit board, thus using a flexible printed circuit (FPC) to attach the LCD substrate and the printed circuit board. Recently, the most common fabricating process to attach the LCD substrate and drive Integrated circuits uses taped automated bonding (TAB) technology, which uses tape to adhere chips thereon, and then the LCD substrate and the printed circuit board are connected to complete the module. This method can save the cost of pre-packaging the IC chips. However, no matter the method that's chosen, testing the module after attaching the LCD substrate and the PCB is important. If the LCD can not function, it is a must to find out where is the problem lies. Hence, it is an important aim to check the alignment.

Conventional checking alignment technology has two methods when the module is using a TAB process. The first method comprises two steps. First step is using an outer lead bonding tester to check the alignment of the attachment of the LCD substrate and tapes. Second step is performing a product test to check the alignment of the attachment of the PCB and tapes. However, with the integrating density and pixels continually advanced, the space of metal leads is shrunk, so the outer lead bonding tester can not apply in such small space. The second method is only to perform a product test after attaching the LCD substrate and the PCB by using the TAB process.

The first method will cause the difficult of the judge because the space of metal leads is too small and there is still need a test after attaching tapes and the PCB. The second method can not judge the fault that comes from the attachment between the LCD substrate and those tapes or between the PCB and those tapes, and can not judge if the fault comes from the abating function of the PCB. If the problem is from the attachment between the LCD substrate and tapes or between the PCB and tapes, it must need operators find out the wrong position by using a magnifying glass. Moreover, conventional method can not find out the direct wrong position because the signal of previous tapes will effect the signal of following tapes.

Both conventional methods need operators to check the alignment with a magnifying glass or focusing equipment, this process is very difficult in return costs time and money. It is important to find a simple and quick method for checking the alignment that does not effect the process.

Referring to FIG. 1, the figure is shown that a liquid crystal display substrate 100 and a printed circuit board (PCB) 130 are attached by using a tape automated bonding process with a plurality of tapes 120. The liquid crystal display substrate 100 comprises following elements. First, a glass substrate having a plurality of outer lead bonding is provided for displaying image and circuits. Then, a spacer is provided to control the space for filling the liquid crystal material. Next, a liquid crystal material and a polarizer are provided to display image and to control the direction of the light. Then, an alignment layer and a color filter are provided to control the array direction of the liquid crystal material and to make the liquid crystal display colorful. Each of those tapes 120 are aligned and connected the LCD substrate 100 and the PCB 130.

Some disadvantages were found in using conventional checking alignment method. One disadvantage of the conventional method is it cannot find which tape is aligned wrong and needs an operator to find the wrong position by using a magnifying glass. This way costs a lot of time and money. Another disadvantage is that the conventional method can not find the wrong position because the signal of previous tapes will effect the signal of following tapes, furthermore it can not judge the fault if the function of the PCB is abating, but the alignment is right.

SUMMARY OF THE INVENTION

An object of the invention is to provide a simple method for checking alignment and finding wrong alignment positions.

Another object of the invention is to connect original dummy lines on the module elements for checking alignment.

Another object of the invention is to judge more than two wrong alignment positions and to quickly find the wrong alignment positions.

A further object of the invention is to use visible processes and equipment and that can simplify-y current checking alignment method to reduce the time and the cost.

In order to achieve previous objects of the invention, a checking alignment method for a printed circuit board is provided and comprises following steps. First, a substrate having a plurality of substrate dummy lines on a surface is provided, wherein those substrate dummy lines are singly connected to a connecting boundary of the substrate. Then, a printed circuit board (PCB) having a plurality of PCB dummy lines on a surface is provided. Wherein PCB dummy lines are singly connected to a connecting boundary of the PCB, which is obverse to the connecting boundary of the substrate, and wherein each of those PCB dummy lines is distinguishingly obverse to each of those substrate dummy lines. Next, a tape automated bonding process is performed to attach the substrate and the PCB with a plurality of tapes, wherein each of those tapes has a plurality of tape dummy lines and those tape dummy lines are singly connected to two connecting boundaries of those tapes. Each of those tape dummy lines is aligned and connected with each of those substrate dummy lines and each of those PCB dummy lines. Following, those substrate dummy lines and those PCB dummy lines are connected to make a circuit on the substrate, those tapes, and the PCB. Last, a circuit testing process is performed to the circuit.

Furthermore, in order to achieve previous objects of the invention, an apparatus for checking alignment in a printed circuit board is provided and comprises following elements. First, a substrate is provided, wherein the substrate has a plurality of substrate dummy lines on a surface, and the substrate dummy lines are singly connected to a connecting boundary of the substrate. Second, a printed circuit board (PCB) is provided, wherein the PCB has a plurality of PCB dummy lines on a surface. The PCB dummy lines are singly connected to a connecting boundary of the PCB and the connecting boundary of the PCB is obverse to the connecting boundary of the substrate. Each of the PCB dummy lines is distinguishingly obverse to each of the substrate dummy lines. Third, a plurality of tapes is provided. Those tapes are used to attach the substrate and the PCB. Each of those tapes has a plurality of tape dummy lines. Those tape dummy lines are singly connected to two connecting boundaries of those tapes. Each of those tape dummy lines is aligned and connected with each of those substrate dummy lines and each of those PCB dummy lines. Those substrate dummy lines and those PCB dummy lines are connected to make a circuit on the substrate, the tapes, and the PCB, and then a circuit testing process is performed to the circuit.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention uses the tape automated bonding process to attach a liquid crystal display cell and a printed circuit board (PCB). Then, original dummy lines, which are on the cell, the PCB, and those tapes, are connected by a welding process to make a testing circuit, which is used for checking alignment.

Figure 1:
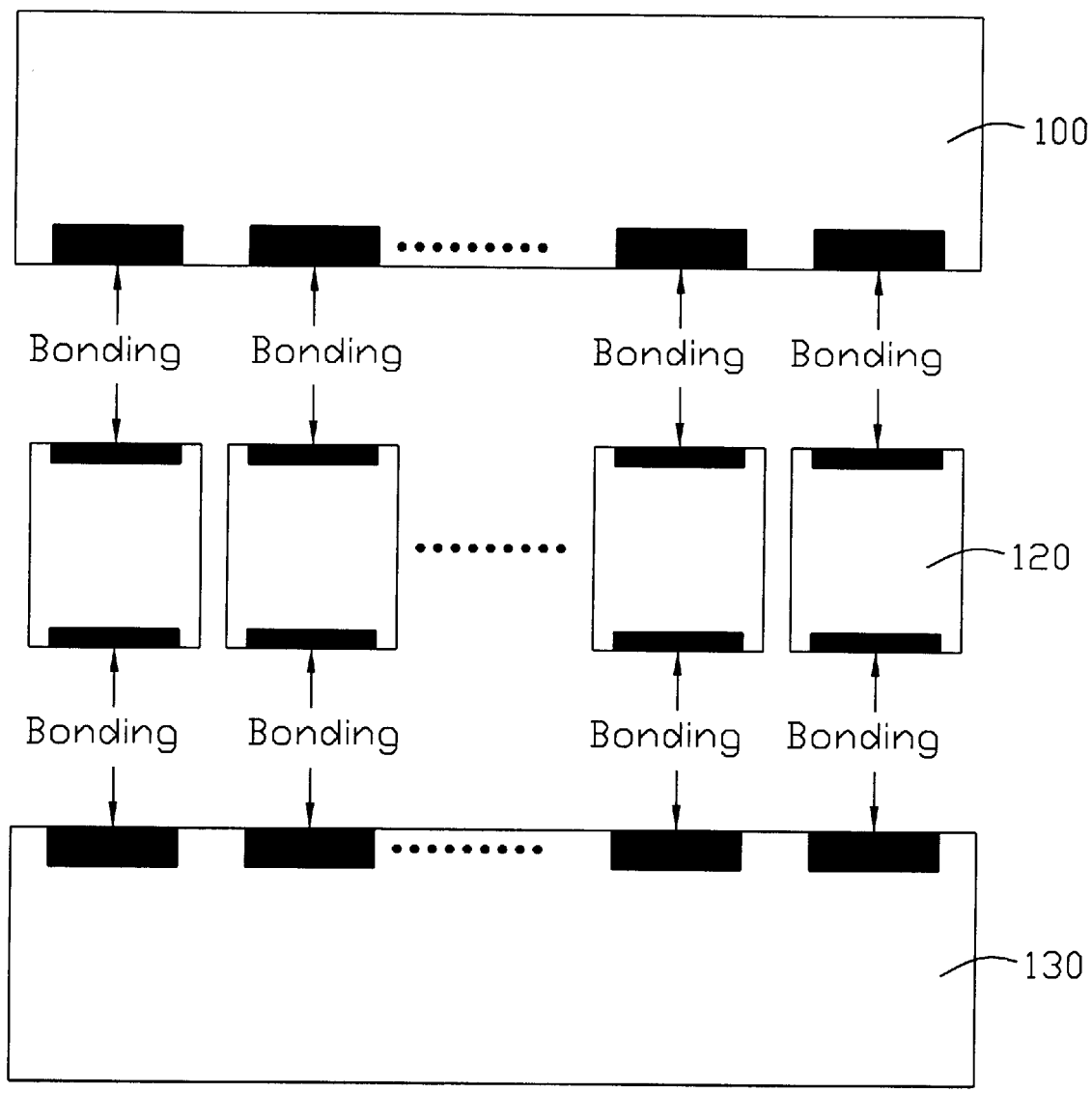
FIG. 1 is a schematic representation of using a tape automated bonding process to attach a liquid crystal display cell and a PCB, in accordance with prior techniques.
Figure 2:
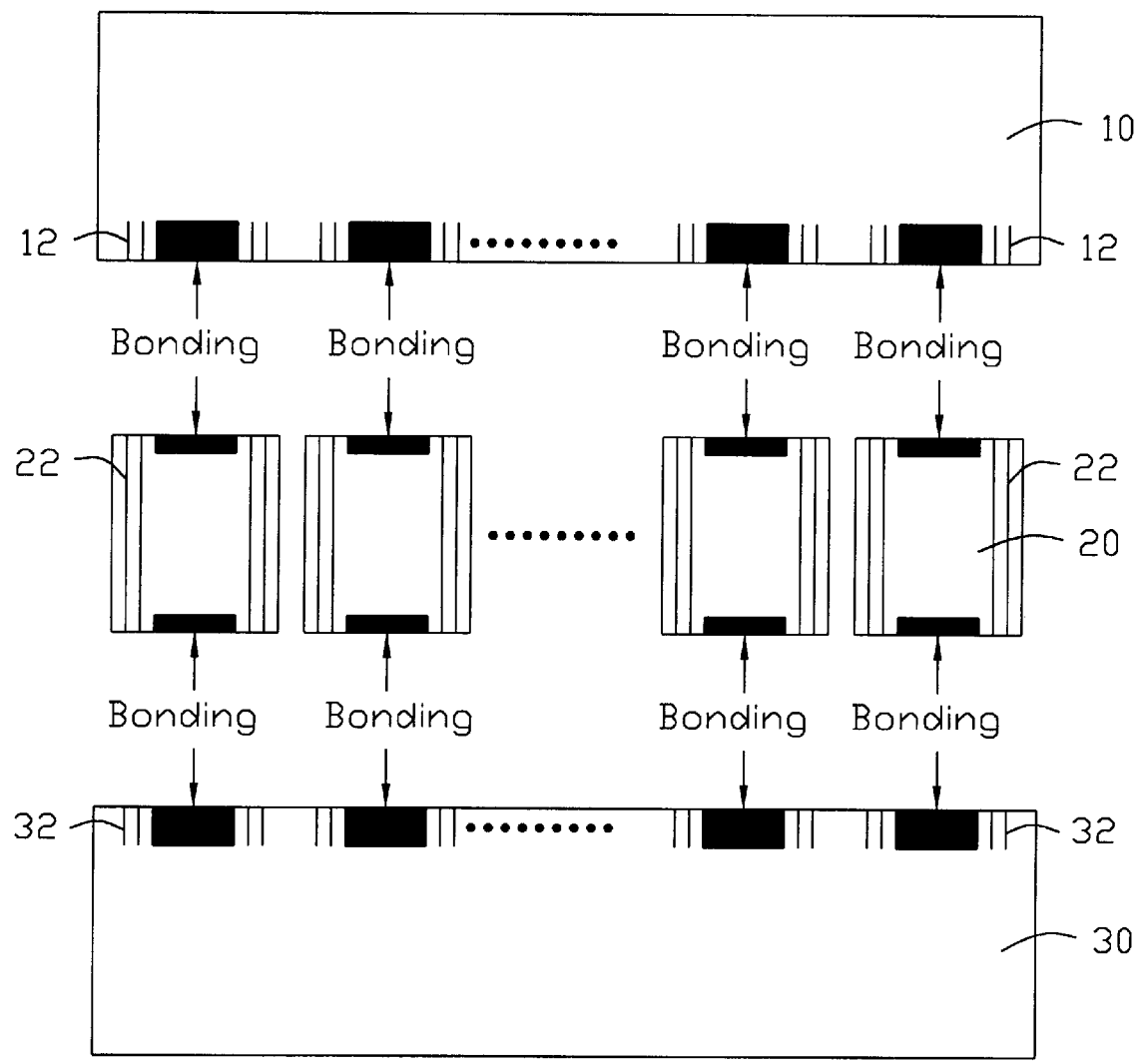
FIG. 2 is a schematic representation of a checking alignment method, in accordance with the present invention.

Referring to FIG. 2, the figure is shown that a liquid crystal display (LCD) substrate 10 and a printed circuit board (PCB) 30 are attached by using a tape automated bonding process with a plurality of tapes 20. The liquid crystal display substrate 10 comprises following elements. First, a glass substrate having a plurality of outer lead bonding is provided for displaying image and circuits. Then, a spacer is provided to control the space for filling the liquid crystal material. Next, a liquid crystal material and a polarizer are provided to display image and to lo control the direction of the light. Then, a alignment layer and a color filter are provided to control the array direction of the liquid crystal material and to make the liquid crystal display colorful.

The LCD substrate 10 has many outer-lead-bonding lines on the surface. Some of those outer-lead-bonding lines are for providing specific circuits and others are reserve lines and remain lines, which is called substrate dummy lines 12 herein. Those substrate dummy lines 12 are singly and vertically connected to a connecting boundary of the LCD substrate 10. However, there are many lines on the PCB 30 for specific devices and circuits, and others are reserve lines and remain lines, which are called PCB dummy lines 32 herein. Those PCB dummy lines 32 are singly and vertically connected to a connecting boundary of the PCB 30, which is obverse to the connecting boundary of the LCD substrate 10. Each of those PCB dummy lines 32 is distinguishingly obverse to each of those substrate dummy lines 12. Each of those tapes 20 except has driving Integrated circuits thereon, but has many remain lines, which is called tape dummy lines 22. If there are not designed remained lines on those tapes 20, it is easily to add these tape dummy lines 22 by current technology. Those tape dummy lines 22 are singly and vertically connected to two connecting boundary of those tapes 20 and each of those tape dummy lines 22 are aligned and singly connected with each of those substrate dummy lines 12 and each of those PCB dummy lines 32. The tapes further comprise a plurality of first pads, which are used to bond the tapes 20 and the LCD substrate 10, and a plurality of second pads, which are used to bond the tapes 20 and the PCB 30. There are not any tape dummy lines 22 between the first pads and the second pads in the tapes.

In the present invention, those substrate dummy lines 12, those tape dummy lines 22, and those PCB dummy lines 32 are obverse and aligned when the circuit design is performed to define each connecting positions of those connecting modules. When the LCD substrate 10, those tapes 20, and the PCB are alignment right, those substrate dummy lines 12, those Tape dummy lines 22, and those PCB dummy lines 32 will be a continued line and be a short line. When the LCD substrate 10, those tapes 20, and the PCB are alignment wrong, those substrate dummy lines 12, those Tape dummy lines 22, and those PCB dummy lines 32 will be a non continued line and be an open line.

Figure 3:
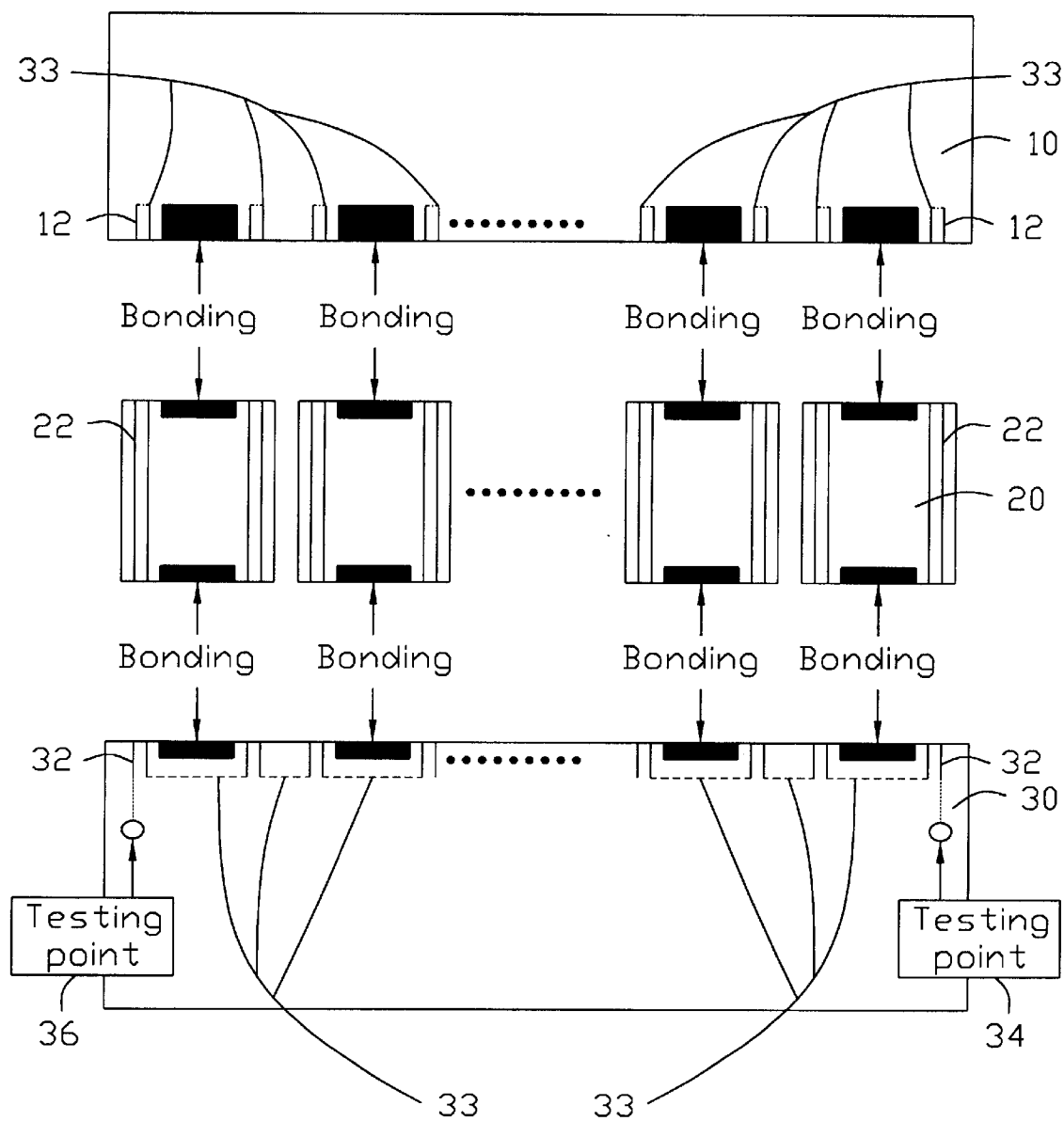
FIG. 3 is a schematic representation of a checking alignment method, in accordance with the present invention.

Referring to FIG. 3, a welding process is performed to connect those substrate dummy lines 12 and those PCB dummy lines 32 to make a testing circuit to the LCD substrate 10, those tapes 20, and the PCB 30. When the LCD substrate 10, those tapes 20, and the PCB are alignment right, those substrate dummy lines 12, the testing circuit will be a continued line and be a short line testing by using a circuit testing process. When the LCD substrate 10, those tapes 20, and the PCB are alignment wrong, those substrate dummy lines 12, those Tape dummy lines 22, and those PCB dummy lines 32 will be a non continued line and be an open line testing by using the circuit testing process. The circuit testing process can be performed easily by selecting any two testing points, such as a testing point 34 and a testing point 36) where the testing circuit is at least through the LCD substrate 10, one of those tapes 20, and the PCB 30. If the testing circuit is a short when it is electrified, that means the alignment is right. If the testing circuit is an open when it is electrified, that means the alignment is wrong. When the alignment is wrong, the present invention can further test the specific circuit which operate against the wrong alignment positions to find out the wrong position by only using the simply circuit testing process.

In short, the present method effectively improves disadvantages of conventional method. For example, conventional method can only judge only a whole alignment result, but can not find out the wrong position because the signal of previous tapes will effect the signal of following tapes. However, when the testing circuit is an open, which means the alignment is wrong, the present invention can operate against the wrong alignment positions to find out the wrong position step-by-step by using the simply circuit testing process. Moreover, the present invention can judge the wrong alignment position is in the connecting position of the LCD substrate 10 and those tapes 20 or in the connecting position of the PCB 30 and those tapes 20. Furthermore, the present invention can make clear if the function of the PCB 30 is wrong to effect the function of the LCD.

To sum up the foregoing, original dummy lines, which are on the cell, the PCB, and those tapes, are connected to make an alignment testing circuit. The present invention uses visible processes and equipment to check alignment. Furthermore, the present invention can judge more than two wrong alignment positions and quickly find each of wrong positions.

Of course, it is to be understood that the invention need not be limited to these disclosed embodiments. Various modification and similar changes are still possible within the spirit of this invention. In this way, the scope of this invention should be defined by the appended claims.

What is claimed is:

1. A checking alignment method for a printed circuit board, said method comprising:

providing a substrate having a plurality of substrate dummy lines on a surface, wherein said substrate dummy lines are singly connected to a connecting boundary of said substrate;

providing a printed circuit board(PCB) having a plurality of PCB dummy lines on a surface, wherein said PCB dummy lines are singly connected to a connecting boundary of said PCB which is obverse to said connecting boundary of said substrate, and wherein each of said PCB dummy lines is distinguishingly obverse to each of said substrate dummy lines;

performing a tape automated bonding process to attach said substrate and said PCB with a plurality of tapes, wherein each of said tapes has a plurality of tape dummy lines, a plurality of first pads, which are used to bond said tape and said substrate, and a plurality of second pads, which are used to bond said tape and said PCB, wherein said tape dummy lines are singly connected to two connecting boundaries of said tapes, and wherein each of said tape dummy lines is aligned and connected with each of said substrate dummy lines and each of said PCB dummy lines and there are not any tape dummy lines between said first pads and said second pads in said tape;

connecting said substrate dummy lines and said PCB dummy lines to make a circuit on said substrate, said tapes, and said PCB; and performing a circuit testing process to said circuit.

2. The method according to claim 1, wherein said substrate is a liquid-crystal-display cell.

3. The method according to claim 1, wherein a welding process is used to connect said substrate dummy lines and said PCB dummy lines.

4. The method according to claim 1, wherein said circuit testing process comprises to test a portion of said circuit which at least through one of said tapes.

5. The method according to claim 4, wherein said circuit testing process is a short means a right alignment.

6. The method according to claim 4, wherein said circuit testing process is an open means a wrong alignment.

7. The method according to claim 1, wherein said circuit testing process comprises to test a portion of said circuit which through more than two of said tapes.

8. The method according to claim 7, wherein said circuit testing process is a short means a right alignment.

9. The method according to claim 7, wherein said circuit testing process is an open means a wrong alignment.

10. A apparatus for checking alignment in a printed circuit board, said apparatus comprising:

a substrate, wherein said substrate has a plurality of substrate dummy lines on a surface, and said substrate dummy lines are singly connected to a connecting boundary of said substrate;

a printed circuit board(PCB), wherein said PCB has a plurality of PCB dummy lines on a surface, and said PCB dummy lines are singly connected to a connecting boundary of said PCB which is obverse to said connecting boundary of said substrate, and wherein each of said PCB dummy lines is distinguishingly obverse to each of said substrate dummy lines; and a plurality of tapes, which comprise a plurality of first pads and a plurality of second pads, wherein said tapes are used to attach said substrate by using said plurality of first pads and said PCB by using said plurality of second pads, and each of said tapes has a plurality of tape dummy lines, and wherein said tape dummy lines are singly connected to two connecting boundaries of said tapes, [and] each of said tape dummy lines is aligned and connected with each of said substrate dummy lines and each of said PCB dummy lines, and there are not any tape dummy lines between said first plurality of pads and said plurality of second pads in said tape, whereby said substrate dummy lines and said PCB dummy lines are connected to make a circuit on said substrate, said tapes, and said PCB, and a circuit testing process is performed to said circuit.

11. The apparatus according to claim 10, wherein said substrate is a liquid-crystal-display cell.

12. The apparatus according to claim 10, wherein a welding process is used to connect said substrate dummy lines and said PCB dummy lines.

13. The apparatus according to claim 10, wherein said circuit testing process comprises to test a portion of said circuit which at least through one of said tapes.

14. The apparatus according to claim 13, wherein said circuit testing process is a short means a right alignment.

15. The apparatus according to claim 13, wherein said circuit testing process is an open means a wrong alignment.

16. The apparatus according to claim 10, wherein said circuit testing process comprises to test a portion of said circuit which through more than two of said tapes.

17. The apparatus according to claim 16, wherein said circuit testing process is a short means a right alignment.

18. The apparatus according to claim 16, wherein said circuit testing process is an open means a wrong alignment.

* * * * *